(12) United States Patent
Goodnow et al.

(10) Patent No.: US 8,010,813 B2
(45) Date of Patent: *Aug. 30, 2011

(54) STRUCTURE FOR SYSTEM FOR EXTENDING THE USEFUL LIFE OF ANOTHER SYSTEM

(75) Inventors: Kenneth J. Goodnow, Essex Junction, VT (US); Stephen G. Shuma, Underhill, VT (US); Oscar C. Strohacker, Leander, TX (US); Mark S. Styduhar, Hinesburg, VT (US); Peter A. Twombly, Shelburne, VT (US); Andrew S. Wienick, South Burlington, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 727 days.

This patent is subject to a terminal disclaimer.

(21) Appl. No.: 12/051,001

(22) Filed: Mar. 19, 2008

(65) Prior Publication Data

US 2008/0168284 A1    Jul. 10, 2008

Related U.S. Application Data

(63) Continuation-in-part of application No. 11/164,646, filed on Nov. 30, 2005, now Pat. No. 7,437,620.

(51) Int. Cl.
G06F 1/00 (2006.01)
G06F 11/00 (2006.01)

(52) U.S. Cl. ............ 713/310; 713/300; 714/41; 714/47; 714/745

(58) Field of Classification Search .................. 713/300, 713/310; 714/47, 41, 745
See application file for complete search history.

(56) References Cited

U.S. PATENT DOCUMENTS

| | | |
|---|---|---|
| 6,456,104 B1 | 9/2002 | Guarin et al. |
| 6,521,469 B1 | 2/2003 | La Rosa et al. |
| 6,574,160 B1 | 6/2003 | Eleyan et al. |
| 6,731,179 B2 | 5/2004 | Abadeer et al. |

(Continued)

FOREIGN PATENT DOCUMENTS

WO    WO 2004/006435    1/2004

OTHER PUBLICATIONS

Goodnow et al., U.S. Appl. No. 12/138,480, Notice of Allowance, Apr. 30, 2010.

(Continued)

*Primary Examiner* — Vincent T Tran
(74) *Attorney, Agent, or Firm* — Gibb I.P. Law Firm, LLC; Michael J. LeStrange, Esq.

(57) ABSTRACT

Disclosed is a design structure for an associated first system for extending product life of a second system in the presence of phenomena that cause the exhibition of both performance degradation and recovery properties within system devices. The first system includes duplicate devices incorporated into the second system (e.g., on a shared bus). These duplicate devices are adapted to independently perform the same function within that second system. Reference signal generators, a reference signal comparator, a power controller and a state machine, working in combination, can be adapted to seamlessly switch performance of that same function within the second system between the duplicate devices based on a measurement of performance degradation to allow for device recovery. A predetermined policy accessible by the state machine dictates when and whether or not to initiate a switch.

18 Claims, 3 Drawing Sheets

U.S. PATENT DOCUMENTS

| | | | |
|---|---|---|---|
| 6,762,961 | B2 | 7/2004 | Eleyan et al. |
| 6,806,743 | B2 | 10/2004 | Saito et al. |
| 6,812,758 | B2 | 11/2004 | Gauthier et al. |
| 6,815,970 | B2 | 11/2004 | Rost et al. |
| 6,933,731 | B2 | 8/2005 | Reddy et al. |
| 7,793,163 | B2 * | 9/2010 | Goodnow et al. ............... 714/47 |
| 2003/0110462 | A1 | 6/2003 | Cohn et al. |
| 2003/0198112 | A1 | 10/2003 | Eleyan et al. |
| 2003/0233624 | A1 | 12/2003 | Reddy et al. |
| 2005/0066298 | A1 | 3/2005 | Visweswariah |
| 2005/0086038 | A1 | 4/2005 | Reddy et al. |
| 2005/0125707 | A1 | 6/2005 | Bonaccio et al. |
| 2005/0134394 | A1 | 6/2005 | Liu |
| 2005/0144524 | A1 | 6/2005 | Bonaccio et al. |
| 2006/0022711 | A1 | 2/2006 | Sumita |

OTHER PUBLICATIONS

Goodnow et al., U.S. Appl. No. 12/051,001, Office Action Communication, Oct. 13, 2009, 13 pages.

Laura Peters, "NBTI: A Grwoing Threat to Device Reliability," http://www.reed-electronics.com/semiconduclor/index.asp?layout=articlePrint&srticleID=..., Mar. 1, 2004, 5 Pages.

* cited by examiner

STRUCTURE FOR SYSTEM FOR EXTENDING THE USEFUL LIFE OF ANOTHER SYSTEM

CROSS-REFERENCE TO RELATED APPLICATIONS

This application is a Continuation-In-Part of U.S. application Ser. No. 11/164,646 filed Nov. 30, 2005, the complete disclosure of which, in its entirety, is herein incorporated by reference.

BACKGROUND OF THE INVENTION

1. Field of the Invention

The invention generally relates to a design structure for performance degradation and recovery properties which impact functional systems, and, more particularly, to a design structure of a first system for extending a useful life of second system by optimizing recovery properties associated with devices incorporated into the second system.

2. Description of the Related Art

Negative Bias Temperature Instability (NBTI) is a phenomenon in which powered-up deep submicron complementary metal oxide semiconductor (CMOS) devices exhibit performance degradation over time (i.e., a performance degradation property, an aging mechanism, etc.). For example, NBTI can cause threshold voltage shifts in p-type CMOS devices. Such threshold voltage shifts potentially are a significant impediment to device scaling to smaller geometries because smaller geometries may necessitate smaller threshold voltages. An additional aspect of the NBTI phenomenon is that a powered-down device will conversely exhibit performance recovery over time (i.e., a recovery property). There is a need for circuit and logic designs that are adapted to optimize this recovery property in order to mitigate the effects of aging mechanisms on the usable lifetime and reliability of functional devices and systems in which they are used.

SUMMARY OF THE INVENTION

In view of the foregoing, disclosed herein is a design structure of a first system and a method for extending the useful life a second system by optimizing the impact of recovery properties on devices within the second system in order to mitigate the effects of aging properties.

An embodiment of the first system of the invention comprises multiple duplicate devices incorporated into the second system and adapted to independently perform the same function within that second system. Reference signal generators, a reference signal comparator, a power controller and a state machine, working in combination, are adapted to switch performance of that same function within the second system between the duplicate devices to allow for device recovery. Ultimately switching between duplicate devices is based on a predetermined policy accessible by the state machine. This policy dictates standards for determining when one or more of the duplicate devices should enter a recovery period and for determining when a duplicate device is ready to exit a recovery period. This policy also provides a schedule for making such determinations and also optionally indicates load distribution management objectives and fault tolerance objectives that can be simultaneously addressed by the system.

More particularly, an embodiment of the first system comprises multiple duplicate devices incorporated into a second system and adapted to independently perform the same function within that second system. Incorporated into each duplicate device is a reference signal generator. Also, incorporated into the system is a predetermined policy, described above, that is stored in memory. A comparator is in communication with each of the reference signal generators and is adapted to initiate generation of reference signals, as directed by a state machine and based on a schedule dictated by the predetermined policy. Specifically, the comparator can initiate generation of reference signals from all or selected duplicate devices at the direction of the state machine by controlling power-up and power-down of the generators independently of the duplicate devices. Once powered-up a reference signal generator generates a signal that indicates a value associated with performance degradation in its corresponding duplicate device. The comparator is adapted to receive and compare the reference signals (e.g., determine a difference between the performance degradation values associated with all or selected duplicate devices). The results of the comparison are communicated back to the state machine.

The state machine is in communication with each of the duplicate devices as well as the comparator. The state machine is adapted to control power-up and power-down of the duplicate devices via a power control system. Specifically, the state machine is adapted to alternately power-up and power-down the duplicate devices based on a minimum difference between the reference signals as dictated by the predetermined policy. In addition to a minimum difference between the reference signals, the state machine may also consider a minimum recovery time required for the duplicate devices from power-down to power-up before ordering the power up a given duplicate device. A counter connected the state machine can be adapted to track recovery times for each device and provide that information to the state machine during the decision-making process. Alternately powering-up and powering-down the duplicate devices allows each of the duplicate devices to recover following performance degradation and, thereby, extends the useful life and reliability of the second system as a whole. Thus, the state machine can further be adapted to predict the useful life, as extended, based on the number of duplicate devices and the respective recovery periods allowed. This prediction can be displayed on demand or as an automatic warning at some pre-selected period from the predicted end of useful life, again as dictated by the policy.

Additional objectives can also be programmed into the policy and controlled by the state machine. For example, the state machine can be adapted to balance load distribution between the duplicate devices by powering-up more than one of the duplicate devices at a time as dictated by load management objectives in the predetermined policy. Similarly, the state machine can be adapted limit powering-up of the duplicate devices based on fault tolerance objectives in the predetermined policy. For example, the system may incorporate a fault detection system that is adapted to detect faults within the duplicate devices and the state machine can be adapted prohibit powering-up of a device based upon specific-type of fault detected by the detection system and communicated to the state machine. The state machine is further adapted to power-down all of the duplicate devices, as dictated by the predetermined policy, based on requirements for performance of said same function within the second system.

An embodiment of a method of the invention for extending the useful life of system comprises incorporating into the system duplicate devices that are adapted to perform the same function within the system. A policy is established that dictates standards for switching performance of that same function between the duplicate devices to allow for device recovery. Specifically, a policy is established that sets standards for determining when one or more of the duplicate devices should enter a recovery period and for determining when a duplicate device is ready to exit a recovery period. The policy also provides a schedule for making such determinations and also optionally indicates load distribution management objectives and fault tolerance objectives that can be simultaneously addressed by the system.

The method further comprises using a comparator to initiate generation of reference signals from the duplicated devices. Each reference signal can emanate from a reference signal generator incorporated into a corresponding duplicate device, as described above. Specifically, each reference signal can indicate a performance degradation value associated with its corresponding duplicate device. The comparator can initiate signal generation from all or selected reference signal generators by controlling power-up and power-down of the generators independent of the duplicate devices, as directed by a state machine and based on a schedule dictated by the predetermined policy. Once the signals are generated, they are received and compared (e.g., by the comparator) to determine the differences between all or selected signals (i.e., to determine the differences between the performance degradation values indicated by the signals).

Then, in order to allow the duplicate devices to recover following performance degradation, the duplicate devices are alternately powered-up and powered-down (e.g., by a state machine, as described above, in conjunction with a power controller) based on a minimum difference between the reference signals as dictated by the predetermined policy. In determining whether to power-up a particular device, the state machine may consider a minimum recovery time required for the duplicate devices from power-down to power-up. This can be accomplished by tracking the recovery times for each device (e.g., by using a counter) and providing this information to the state machine during the determination process). Allowing the duplicate devices to recover following performance degradation extends the useful life of the system. Thus, the method can further comprise predicting the useful life, as extended, based on the number of duplicate devices and the respective recovery periods allowed. This prediction can be displayed to a user on demand or as an automatic warning at some pre-selected period from the predicted end of useful life, again as dictated by the policy.

Additional objectives can also be accomplished by embodiment of the method. These additional objectives can be incorporated into the policy and controlled, e.g., by the state machine. Specifically, the method can comprise balancing load distribution between the duplicated devices in the system by powering-up more than one of the duplicate devices at the same time as dictated by load management objectives in the predetermined policy. The method can also comprise detecting faults in the duplicate devices (e.g., by using a fault detection system in communication with the state machine) and by limiting powering-up of the duplicate devices based on fault tolerance objectives in the predetermined policy. Lastly, the method can comprise determining when performance of the function provided by the duplicate devices is required by the system and powering-down all of the duplicate devices (i.e., initiating an all-rest period) when that function is not required (e.g., during a period of prolonged inactivity) as dictated by the predetermined policy.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
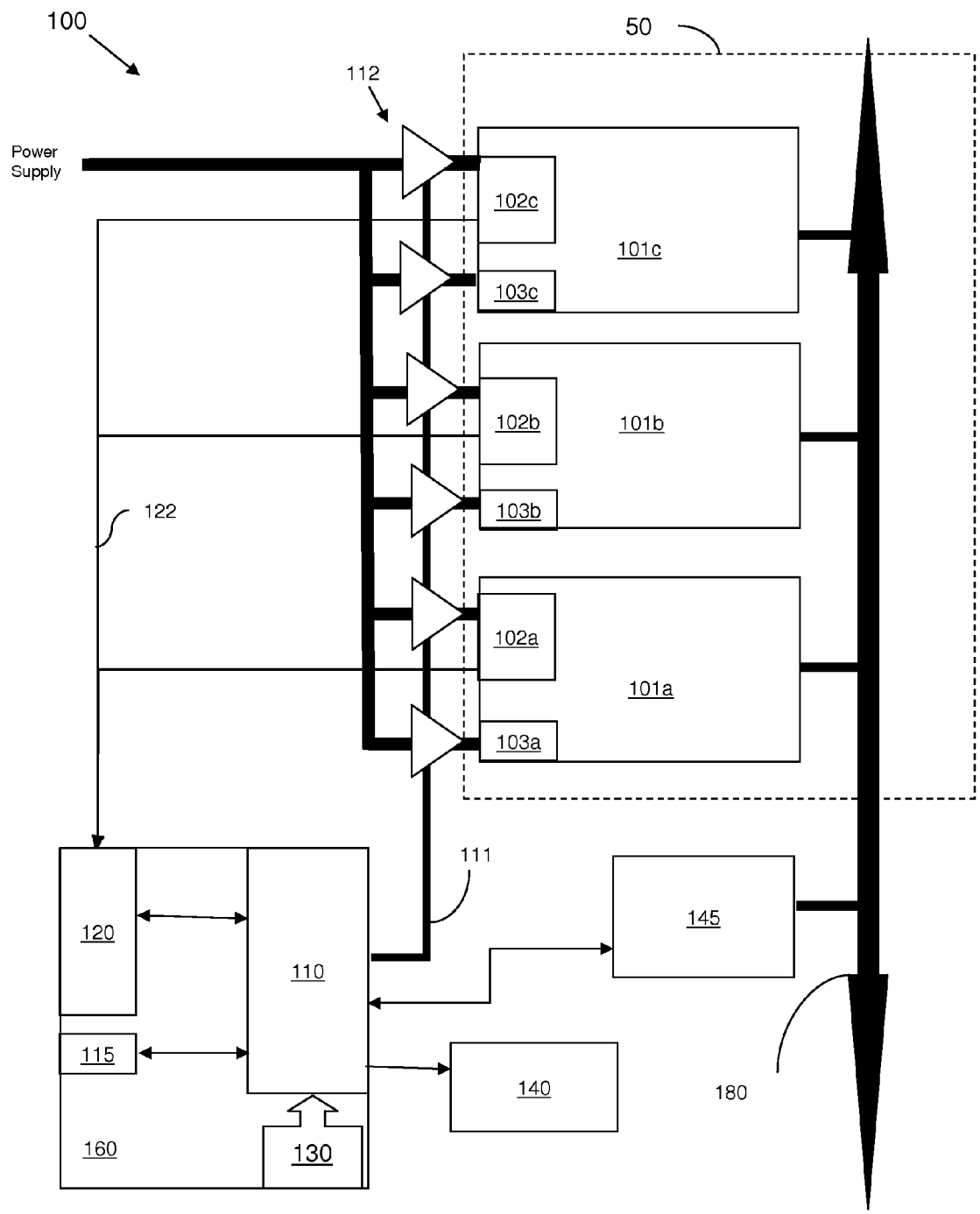
FIG. 1 is a schematic block diagram illustrating an embodiment of a system of the invention; and, FIG. 2 is a schematic flow diagram illustrating an embodiment of the method of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

As mentioned above, phenomena such as Negative Bias Temperature Instability (NBTI) can cause powered-up devices to exhibit performance degradation (e.g., threshold voltage shifts) over time. Such phenomena will also conversely cause powered-down devices to exhibit performance recovery over time, as illustrated in "NBTI: A Growing Threat to Device Reliability", Laura Peters, Semiconductor International, Mar. 1, 2004 (incorporated herein by reference). Thus, the existence of phenomena that cause devices to exhibit performance degradation properties when in use and recovery properties when at rest are known. However, there remains a need for circuit and logic designs that are adapted to optimize recovery properties in order to mitigate the effects of performance degradation properties and, thereby, extend the useful life and enhance the reliability of functional devices and systems in which they are used.

Disclosed herein are embodiments of a system (i.e., a first system) that are capable of extending product life of another system (i.e., a second system) in the presence of phenomena, such as NBTI, that cause the exhibition of both performance degradation and recovery properties in devices. Product life extension (e.g., by as much as 10×) is accomplished by periodically switching between redundant instances of circuitry (i.e., duplicate devices adapted to perform the same function) within the second system not because of failure or simply passage of time, but rather because of a determined need for a device to rest and recover prior to failure (e.g., based on a comparison of a measured degradation for each duplicate device). The need for rest and recovery can be determined, according to a predetermined schedule, based on a minimum degradation difference to prevent too-rapid switching between duplicate devices. Thus, the switching is based primarily on the need to prevent failure, not on fault tolerance. However, if a fault is detected (e.g., by an integrated fault detection system) the decision to switch to a given device can additionally be based on fault tolerance objectives.

More particularly, disclosed herein are embodiments of a system (i.e., a first system) and a method for extending the useful life another system (i.e., a second system) by optimizing the impact of recovery properties on devices within the second system in order to mitigate the effects of aging properties.

Referring to FIG. 1, an embodiment of the first system 100 of the invention is adapted for use with a second system 50 (e.g., a system comprising electronic and/or other type components, a system comprising multiple integrated circuits, a system comprising a System-on-Chip (SOC) integrated circuit, etc.). The second system 50 requires the incorporation of at least one device 101 (e.g., a discrete unit of circuitry, a single processor, etc.) to perform a specific function. The required device is a type that exhibits both performance degradation and recovery properties.

The first system 100 comprises multiple instances of that required device 101a-c (e.g., redundant processors, redundant units of circuitry, etc.) incorporated into the second system 50 (e.g., on a shared bus 180 using existing bus designs such as an industry standard bus, if possible). These duplicate devices 101a-c are adapted to independently perform the same function within that second system 50. Devices that are powered-up are stressed and subject to performance degradation (e.g., threshold shifts). Devices that are powered-down are in rest state (i.e., a recovery period). The first system 100 can be configured such that each duplicate device 101a-c can be seamlessly powered-up and down without causing the failure of or performance interruption within the second system 50. Thus, each duplicate device 101a-c can serve as a reliever for the other duplicate devices on the bus. Reference signal generators 102a-c, a reference signal comparator 120, a power controller 112 and a state machine 110, working in combination, are adapted to switch performance of that same function within the second system between the duplicate devices 101a-c based on a measurement of performance degradation (e.g., threshold degradation) to allow for device recovery. Ultimately switching between duplicate devices 101a-c is based on a predetermined policy 130 stored in memory and accessible by the state machine 110. The policy 130 dictates standards for determining when one or more of the duplicate devices 101a-c should enter a recovery period and for determining when a duplicate device is ready to exit a recovery period. This policy 130 also provides a schedule for making such determinations and optionally indicates load distribution management objectives and fault tolerance objectives that can be simultaneously addressed by the system 100.

A reference degradation signal generator 102a-c is incorporated into each duplicate device. Each generator 102a-c can be configured with any suitable mechanism for independently tracking the degradation of its corresponding duplicate device 101a-c. Specifically, each generator 102a-c can comprise a circuit or multiple circuits adapted to determine or estimate some value associated with performance degradation in its corresponding duplicate device and to produce an analog, digital or mixed signal 122 that indicates that value.

For example, each generator may incorporate a pair of identical ring oscillators to monitor device performance degradation, as illustrated in U.S. patent application Ser. No. 10/745,427, Pub. No. 2005/0134394, published on Jun. 23, 2005, and incorporated herein by reference. One of the ring oscillators can be enabled whenever the corresponding duplicate device is powered-up so that it is simultaneously under stress with the device. The other is selectively enabled only when a comparison is necessary. The selectively enabled ring oscillator provides a reference output to compare with the aged or degraded ring oscillation output. By comparing the two outputs, a frequency degradation value for the stressed ring oscillator can be obtained. This frequency degradation value represents a performance degradation measurement for the corresponding duplicate device and can be signaled to the comparator.

Alternatively, each generator may incorporate a p-type metal oxide semiconductor (PMOS) transistor to monitor device performance degradation. The PMOS transistor can be powered-up (i.e., stressed) whenever the corresponding duplicate device is powered-up and powered-down (i.e., rested) whenever the corresponding duplicate device is powered-down. A measurement of threshold voltage shift in the PMOS transistor can represent performance degradation measurement for the corresponding duplicate device and can be signaled to the comparator.

In either mechanism described above, the only time generators 102a-c would be powered-up when the corresponding duplicate device 101a-c was not is when the duplicate device is at rest and a comparison of reference signals 122 between multiple duplicate devices is required. Consequently, the measured frequency degradation value resulting from the comparison of the ring oscillators or, alternatively, the measured threshold shift value for the PMOS transistor, will indicate worst-case performance degradation values for the corresponding duplicate devices 101a-c.

The predetermined policy 130, as described above, that is incorporated into the system 100 may be either generic (e.g., provided by a manufacture for use with a variety of duplicate device types) or custom (e.g., user determined depending upon the application), and stored in memory (e.g., on-chip memory). The policy may vary over the life of the devices 101a-c and may be externally programmable.

The comparator 120 (i.e., the reference signal comparator, the reference degradation signal measurement and comparison subsystem, etc.) is in communication with each of the reference signal generators 102a-c and is adapted to initiate generation of reference signals, as directed by a state machine 110 and based on a schedule dictated by the predetermined policy 130. Specifically, the comparator 120 can initiate generation of reference signals from all or selected duplicate devices 101a-c at the direction of the state machine 110 by controlling power-up and power-down of the generators 102a-c independently of the duplicate devices via power control system 112 using one or more analog, digital or mixed signal circuits. Once powered-up a reference signal generator 102a-c generates a signal that indicates some value associated with performance degradation in the corresponding duplicate device 101a-c (e.g., a threshold voltage shift measurement, a frequency degradation value, etc.). The comparator 120 is adapted to receive and to differentially measure and compare the reference signals 122 (e.g., determine a difference between the values such as, threshold shift measurement values or frequency degradation values, of all or selected duplicate devices). The results of the comparison are communicated back to the state machine 110.

The state machine 110 (i.e., a recovery control state machine) is in communication with each of the duplicate devices 101a-c as well as the comparator 120. The state machine 110 is adapted to determine which duplicate devices 101a-c to employ and, together with the power control system 112, to seamlessly enable and disable (i.e., power-up and power-down) the duplicate devices 101a-c. For example, in order to accomplish a switch a device (e.g., 101a) can be signaled to save its state, flush its cache and to shut down while another device (e.g., 101b) can be powered-up, loaded with that state and signaled to continue execution of the task (i.e., performance of the function). Specifically, the state machine 110 is adapted to alternately power-up and power-down the duplicate devices 101a-c based on a minimum difference between the reference signals 122 emanating from each generator 102a-c, as dictated by the predetermined policy. In addition to a minimum difference between the reference signals 122, the state machine 100 may also consider a minimum recovery time required for the duplicate devices from power-down to power-up before ordering the power up of a given duplicate device. A counter 115 (i.e., a time-since-last-switch counter) connected and resettable by the state machine 110 can be adapted to track recovery times for each device 101a-c and provide that information to the state machine 110 during the decision-making process to prevent premature switching. Alternately powering-up and powering-down the duplicate devices 101a-c allows each device to recover following performance degradation and, thereby, extends the useful life and reliability of the second system 50 itself. Specifically, powering down a duplicate device following performance degradation of that device relative to another device, allows the powered-down device to recover. If each device is given an opportunity to recover based upon relative performance degradation, the useful life of the system will be extended. Thus, the state machine 110 or a subsystem thereof can further be adapted to predict the useful life, as extended, of the second system 50 based on the number of duplicate devices and the respective recovery periods allowed. This prediction can be externally displayed (see display 140) on demand or as an automatic warning at some pre-selected period from the predicted end of useful life (e.g., indicating an imminent unrecoverable device failure), again as dictated by the policy 130.

Additional objectives can also be programmed into the policy 130 and controlled by the state machine 110. For example, the state machine 110 can be adapted to balance load distribution (e.g., surge on demand) between the duplicate devices 101a-c by powering-up more than one of the device at a time as dictated by load management objectives in the predetermined policy 130. Similarly, the state machine 110 can be adapted to limit powering-up of the duplicate devices based on fault tolerance objectives in the predetermined policy 130. For example, the first system 100 may incorporate a fault detection system 145 that is adapted to detect faults within the duplicate devices and the state machine can be adapted to prohibit powering-up of a device based upon specific-type of fault detected by the detection system and communicated to the state machine. Those skilled in the art will recognize that fault detections systems 145 are well known in the art and it is anticipated that a variety of different systems may be incorporated into the system 100 of the invention. The state machine 110 can further be adapted to power-down all of the duplicate devices (i.e., initiate an all-rest state), as dictated by the predetermined policy, based on requirements within the second system 50 for performance of the function provided by the devices. Optionally, the first system 100 can incorporate odometers 103a-c associated with each duplicate device 101a-c to monitor total on-times for each device and to consider these times in making the switching decision.

Those skilled in the art will recognize that while FIG. 1 illustrates various components of the first system 100 (e.g., the state machine 110, the comparator 120, the policy memory 130, the counter 115, etc.) incorporated into a single controller 160, it is anticipated that multiple controllers and/or discrete components may also be used to implement the first system 100 of the invention, as described above.

An exemplary implementation mechanism for selectively controlling power and reset sequences to duplicate devices (i.e., the redundant instances of circuitry) and reference signal generators (i.e., reference degradation signal generation sub-circuits) and for comparing reference signals follows. Those skilled in the art will recognize that while this implementation mechanism is illustrated for use with reference signal generators configured to measure threshold voltage shifts of a PMOS transistor, a similar implementation mechanism may be used with reference signal generators that are configured to determine frequency degradation values using ring oscillator comparisons.

The recovery control state machine 110 can execute the following sequence of steps:

```
BEGIN
If exiting_reset OR comparison_timer_expired
then
    if( not exiting_reset )
    then
        previous_instance := current_instance
    endif
    for instance I ( 1 to N )
        measure_VTD( I )
        if( VTD( I ) < min_instance_VTD )
        then
            if( exiting_reset )
            then
                current_instance := I
            else if ( VTD( previous_instance) − VTD( I) > threshold_to_switch )
            then
                current_instance := I
            endif
            min_instance_VTD := VTD(I)
        endif
    endfor
    if min_instance_VTD > impending_failure_VTD
    then
        set impending_failure_warning_signal
    endif
    if( exiting_reset OR previous_instance != current_instance )
    then
        power up current instance
        load core state and enable current instance
        if ( not exiting reset )
        then
            powerdown previous instance
        endif
    endif
    initialize comparison_timer
endif
go to BEGIN
```

The comparator 120 (i.e., the reference degradation signal measurement and comparison subsystem) can execute the following steps when triggered by the state machine. These steps are essentially a subroutine, and are indicated in the above flow by measure VTD(I).

```
Pseudocode: measure VTD of instance I
BEGIN
Power-up unstressed VT reference transistors for instance I
Power-up stressed VT reference transistors for instance I ( already
powered if I is current instance)
    Power-up VT difference measurement signal generation circuit for
instance I
    Read and capture VTD(I) := VT stressed − VT unstressed reference
transistors for instance I
    Power-down unstressed VT reference transistors for instance I
    Power-down stressed VT reference transistors for instance I unless I
```

```
is current instance
    Power-down VT difference measurement signal generation circuit for
instance I
        DONE
```

Figure 2:
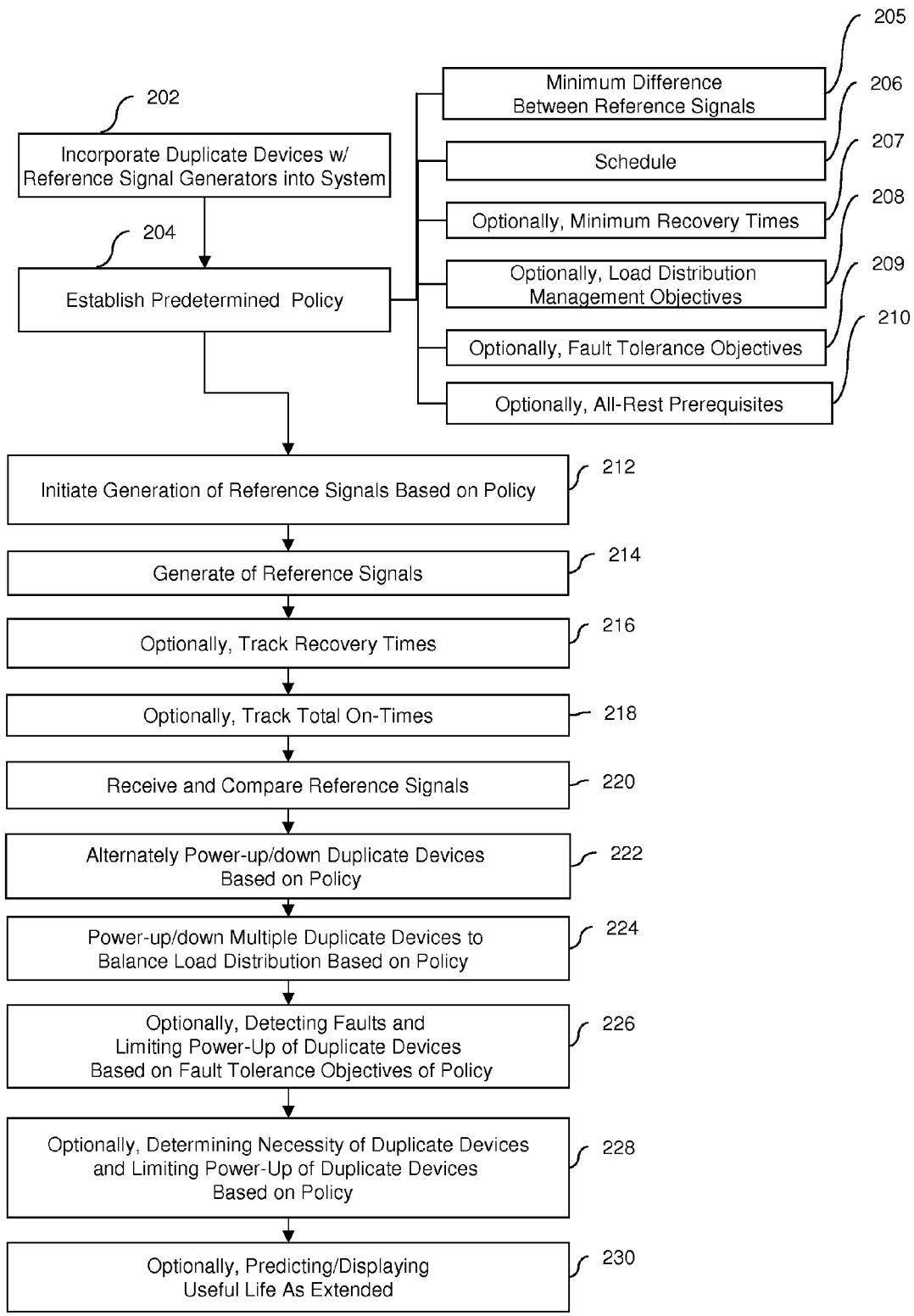

Referring to FIG. 2 in combination with FIG. 1, an embodiment of a method of the invention for extending the useful life of a system 50 (e.g., a system comprising electronic and/or other type components, a system comprising multiple integrated circuits, a system comprising a System-on-Chip (SOC) integrated circuit, etc.) comprises incorporating into the system 50 duplicate devices 101a-c (e.g., redundant processors, redundant units of circuitry, etc.) that exhibit performance degradation and recovery properties and that are adapted to perform the same function within the integrated circuit (202). A policy 130 is established that dictates standards for switching performance of that same function between the duplicate devices 101a-c to allow for device recovery while permitting seamless execution of the function (204). Specifically, a policy is established that sets standards for determining when one or more of the duplicate devices should enter a recovery period and for determining when a duplicate device is ready to exit a recovery period (e.g., a minimum difference between reference signals 205, minimum recovery times, all-rest pre-requisites 210, etc.). The policy 130 also provides a schedule for making such determinations 206 and also optionally indicates load distribution management objectives 208 and fault tolerance objectives 209 that can be simultaneously addressed by the system 100.

The method further comprises using a comparator 120 to initiate generation of reference signals from the duplicated devices (212). Each reference signal 122 can emanate from a reference signal generator 102a-c incorporated into a corresponding duplicate device 101a-c, as described in detail above (214). Specifically, each reference signal 122 can indicate a performance degradation value (e.g., a threshold shift measurement, a frequency degradation measurement, etc.) associated with its corresponding duplicate device 101a-c. The comparator 120 can initiate signal generation from all or selected reference signal generators by controlling power-up and power-down of the generators (e.g., via power control system 112) independently of powering-up the duplicate devices 101a-c, as directed by a state machine 110 and based on a schedule dictated by the predetermined policy 130. Once the signals 122 are generated (at process 214), they are received and compared (e.g., by the comparator 120) to determine the differences between all or selected signals (i.e., to determine the differences between the performance degradation values indicated by the signals) (220).

Then, in order to allow the duplicate devices to recover following performance degradation, the duplicate devices 101a-c are alternately powered-up and powered-down (e.g., by a state machine 110, as described above, in conjunction with the power control system 112) based on a minimum difference between the reference signals 122, as dictated by the predetermined policy 130 (222). Specifically, powering down a duplicate device following performance degradation of that device relative to another device, allows the powered-down device to recover. If each device is given an opportunity to recover based upon relative performance degradation, the useful life of the system will be extended. In determining whether to power-up a particular device, the state machine 110 may consider a minimum recovery time (see 207) required for the duplicate devices from power-down to power-up. This can be accomplished by tracking the recovery times for each device 101a-c (e.g., by using a counter 115) and providing this information to the state machine 110 during the determination process (218). Allowing the duplicate devices to recover following performance degradation extends the useful life of the system 50. Thus, the method can further comprise predicting the useful life, as extended, based on the number of duplicate devices and the respective recovery periods allowed (230). This prediction can be accomplished by the state machine 110 or a subsystem thereof and can be displayed on a display 140 to a user on demand or as an automatic warning at some pre-selected period from the predicted end of useful life, again as dictated by the policy 130.

Figure 3:
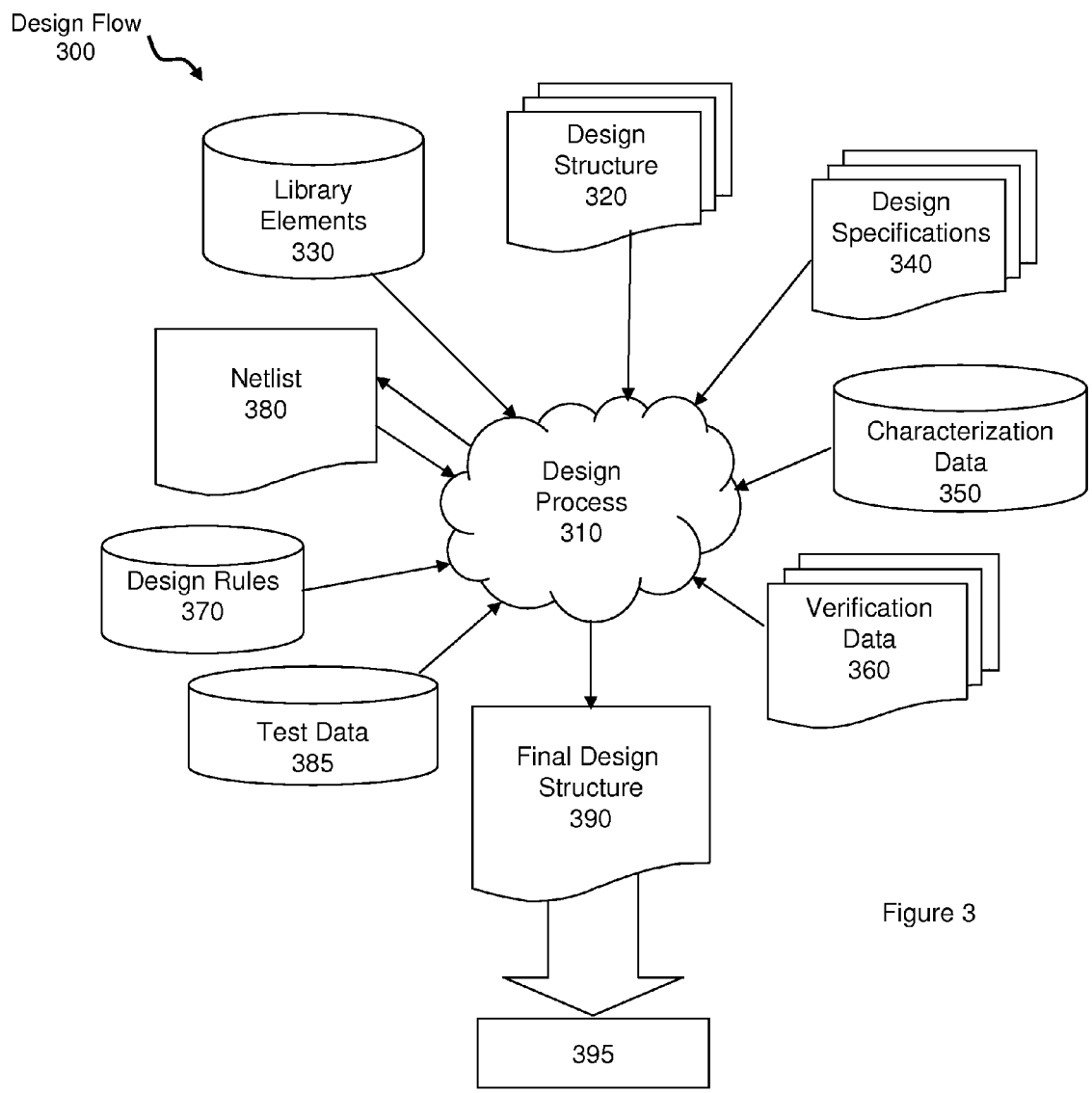
FIG. 3 is a flow diagram of a design process used in semiconductor design, manufacture, and/or test.

FIG. 3 shows a block diagram of an exemplary design flow 300 used for example, in semiconductor design, manufacturing, and/or test. Design flow 300 may vary depending on the type of IC being designed. For example, a design flow 300 for building an application specific IC (ASIC) may differ from a design flow 300 for designing a standard component or from a design from 300 for instantiating the design into a programmable array, for example a programmable gate array (PGA) or a field programmable gate array (FPGA) offered by Altera® Inc. or Xilinx® Inc. Design structure 320 is preferably an input to a design process 310 and may come from an IP provider, a core developer, or other design company or may be generated by the operator of the design flow, or from other sources. Design structure 320 comprises an embodiment of the invention as shown in FIG. 1 in the form of schematics or HDL, a hardware-description language (e.g., Verilog, VHDL, C, etc.). Design structure 320 may be contained on one or more machine readable medium. For example, design structure 320 may be a text file or a graphical representation of an embodiment of the invention as shown in FIG. 1. Design process 310 preferably synthesizes (or translates) an embodiment of the invention as shown in FIG. 1 into a netlist 380, where netlist 380 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 380 is resynthesized one or more times depending on design specifications and parameters for the circuit.

Design process 310 may include using a variety of inputs; for example, inputs from library elements 330 which may house a set of commonly used elements, circuits, and devices, including models, layouts, and symbolic representations, for a given manufacturing technology (e.g., different technology nodes, 32 nm, 45 nm, 90 nm, etc.), design specifications 340, characterization data 350, verification data 360, design rules 370, and test data files 385 (which may include test patterns and other testing information). Design process 310 may further include, for example, standard circuit design processes such as timing analysis, verification, design rule checking, place and route operations, etc. One of ordinary skill in the art of integrated circuit design can appreciate the extent of possible electronic design automation tools and applications used in design process 310 without deviating from the scope and spirit of the invention. The design structure of the invention is not limited to any specific design flow.

Design process 310 preferably translates an embodiment of the invention as shown in FIG. 1, along with any additional integrated circuit design or data (if applicable), into a second design structure 390. Design structure 390 resides on a storage medium in a data format used for the exchange of layout data of integrated circuits and/or symbolic data format (e.g.

information stored in a GDSII (GDS2), GL1, OASIS, map files, or any other suitable format for storing such design structures). Design structure 390 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1. Design structure 390 may then proceed to a stage 395 where, for example, design structure 390: proceeds to tape-out, is released to manufacturing, is released to a mask house, is sent to another design house, is sent back to the customer, etc.

Additional objectives can also be accomplished by embodiment of the method. These additional objectives can be incorporated into the policy 130 (see 208-209) and controlled, e.g., by the state machine 110. Specifically, the method can comprise balancing load distribution between the duplicated devices 101a-c in the integrated circuit by powering-up more than one of the duplicate devices at the same time as dictated by load management objectives 208 in the predetermined policy 130. The method can also comprise detecting faults in the duplicate devices (e.g., by using a fault detection system 145 in communication with the state machine 110) and by limiting powering-up of the duplicate devices based on fault tolerance objectives 209 in the predetermined policy 130 (226). Lastly, the method can comprise determining when performance of the function provided by the duplicate devices is required by the integrated circuit and powering-down all of the duplicate devices (i.e., initiating an all-rest period) when that function is not required (e.g., during a period of prolonged inactivity) as dictated by the predetermined policy 130 (228).

Embodiments of the system and computer implemented method of the invention, described above, can take the form of an entirely hardware embodiment or an embodiment including both hardware and software elements. In one embodiment, the invention is implemented using software, which includes but is not limited to firmware, resident software, microcode, etc. Furthermore, embodiments can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

The method and system of the invention, described above, are an improvement over other techniques which incorporate redundant instances of circuitry and switch between the instances based upon fault tolerances or passage of time (e.g., schedule maintenance based on power-on hours) because such techniques lead to uneven wear out of the circuitry and a lower overall useful life extension. Additionally, the system of the invention is an improvement over other techniques because it is stateless. Specifically, the system is not required to remember anything before powering-up devices. Therefore, it does not require non-volatile storage elements on or off-chip in order to work.

Therefore, disclosed above are embodiments of a method and an associated first system for extending product life of second system in the presence of phenomena, such as NBTI, that cause the exhibition of both performance degradation and recovery properties in system devices. The first system of the invention comprises multiple duplicate devices incorporated into the second system on a shared bus. These duplicate devices are adapted to independently perform the same function within that second system. Reference signal generators, a reference signal comparator, a power controller and a state machine, working in combination, are adapted to seamlessly switch performance of that same function within the second system between the duplicate devices based on a measurement of performance degradation. This switching process allows each duplicate device to recover following performance degradation. Ultimately switching between duplicate devices is based on a predetermined policy accessible by the state machine. Fault tolerance objectives and load management objectives may optionally be considered when deciding when and whether or not to switch a performance function between devices.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the invention can be practiced with modification within the spirit and scope of the appended claims.

What is claimed is:

1. A design structure embodied in a machine readable medium, the design structure comprising a first system for extending the useful life of a second system, said first system comprising:

duplicate devices each adapted to independently perform a same function within said second system, said duplicate devices exhibiting, when powered-up, performance degradation over time and further exhibiting, when powered-down, performance recovery over time;

reference signal generators incorporated into each of said duplicate devices and adapted to track said performance degradation of said duplicate devices and to generate reference signals indicating values associated with said performance degradation, wherein each reference signal generator generates a corresponding reference signal that indicates, for a corresponding duplicate device, a performance degradation value associated with said corresponding duplicate devices;

a comparator adapted to receive and compare said reference signals so as to determine differences between said values; and a state machine in communication with said comparator and with each of said duplicate devices, wherein said state machine is adapted to selectively power-up and power-down said duplicate devices as dictated by a predetermined policy and based, at least in part, on a minimum difference between said values, and wherein selectively powering-up and powering-down said duplicate devices allows said duplicate devices to recover following said performance degradation.

2. The design structure of claim 1, wherein said comparator is further adapted to initiate generation of said reference signals as directed by said state machine based on a schedule dictated by said predetermined policy.

3. The design structure of claim 1, wherein said comparator is further adapted to initiate generation of said reference signals by controlling power-up and power-down of said reference signal generators independently of said duplicate devices.

4. The design structure of claim 1, wherein allowing said duplicate devices to recover extends said useful life of said second system and wherein said state machine is further adapted to predict said useful life as extended.

5. The design structure of claim 1, wherein said predetermined policy further dictates a minimum recovery time required for said duplicate devices from power-down to power-up and wherein said first system further comprises a counter connected to said state machine and adapted to track recovery times.

6. The design structure of claim 1, wherein the design structure comprises a netlist.

7. The design structure of claim 1, wherein the design structure resides on storage medium as a data format used for the exchange of layout data of integrated circuits.

8. The design structure of claim 1, wherein the design structure resides in a programmable gate array.

9. A design structure embodied in a machine readable medium, the design structure comprising a first system for extending the useful life of a second system, said first system comprising:

duplicate devices each adapted to independently perform a same function within said second system, said duplicate devices exhibiting, when powered-up, performance degradation over time and further exhibiting, when powered-down, performance recovery over time;

reference signal generators incorporated into each of said duplicate devices and adapted to track said performance degradation of said duplicate devices and to generate reference signals indicating values associated with said performance degradation, wherein each reference signal generator generates a corresponding reference signal that indicates, for a corresponding duplicate device, a performance degradation value associated with said corresponding duplicate device;

a comparator adapted to receive and compare said reference signals so as to determine differences between said values; and a state machine in communication with said comparator and with each of said duplicate devices, wherein said state machine is adapted to selectively power-up and power-down said duplicate devices as dictated by a predetermined policy and based, at least in part, on a minimum difference between said values, wherein selectively powering-up and powering-down said duplicate devices allows said duplicate devices to recover following said performance degradation, and wherein said state machine is further adapted to balance load distribution by powering-up more than one of said duplicate devices simultaneously as dictated by load management objectives in said predetermined policy.

10. The design structure of claim 9, further comprising a fault detection system adapted to detect faults in said duplicate devices, wherein said state machine is in communication with said fault detection system and is further adapted limit powering-up of said duplicate devices based on fault tolerance objectives in said predetermined policy.

11. The design structure of claim 9, wherein said state machine is further adapted to power-down all of said duplicate devices, as dictated by said predetermined policy, based on requirements for performance of said same function within said second system.

12. The design structure of claim 9, wherein said comparator is further adapted to initiate generation of said reference signals as directed by said state machine based on a schedule dictated by said predetermined policy.

13. The design structure of claim 9, wherein said comparator is further adapted to initiate generation of said reference signals by controlling power-up and power-down of said reference signal generators independently of said duplicate devices.

14. The design structure of claim 9, wherein allowing said duplicate devices to recover extends said useful life of said second system and wherein said state machine is further adapted to predict said useful life as extended.

15. The design structure of claim 9, wherein said predetermined policy further dictates a minimum recovery time required for said duplicate devices from power-down to power-up and wherein said first system further comprises a counter connected to said state machine and adapted to track recovery times.

16. The design structure of claim 9, wherein the design structure comprises a netlist.

17. The design structure of claim 9, wherein the design structure resides on storage medium as a data format used for the exchange of layout data of integrated circuits.

18. The design structure of claim 9, wherein the design structure resides in a programmable gate array.

* * * * *